United States Patent
Liu et al.

(10) Patent No.: US 6,774,045 B1
(45) Date of Patent: Aug. 10, 2004

(54) RESIDUAL HALOGEN REDUCTION WITH MICROWAVE STRIPPER

(75) Inventors: Shenjian Liu, Fremont, CA (US); Gregory James Goldspring, Alameda, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/189,756

(22) Filed: Jul. 2, 2002

Related U.S. Application Data

(60) Provisional application No. 60/304,905, filed on Jul. 11, 2001.

(51) Int. Cl.[7] .............................................. H01L 21/302
(52) U.S. Cl. ........................ 438/709; 438/694; 438/699; 438/702; 438/718
(58) Field of Search ................................ 438/694, 699, 438/702, 709, 718, 690, 706, 759

(56) References Cited

U.S. PATENT DOCUMENTS

| | | | |
|---|---|---|---|
| 4,961,820 A | * 10/1990 | Sinagawqa et al. | ............ 3/643 |
| 6,231,775 B1 | * 5/2001 | Levenson et al. | ............. 216/67 |
| 6,503,840 B2 | * 1/2003 | Catabay et al. | ............. 438/694 |

* cited by examiner

*Primary Examiner*—Long Pham
*Assistant Examiner*—Wai-Sing Louie
(74) *Attorney, Agent, or Firm*—Lam Research Corporation

(57) ABSTRACT

This invention relates to a method for reducing halogen gasses and byproducts in post-etch applications. The method consists of exposing the substrate to $O_2/N_2$ plasma and water vapor in a process chamber.

18 Claims, 6 Drawing Sheets

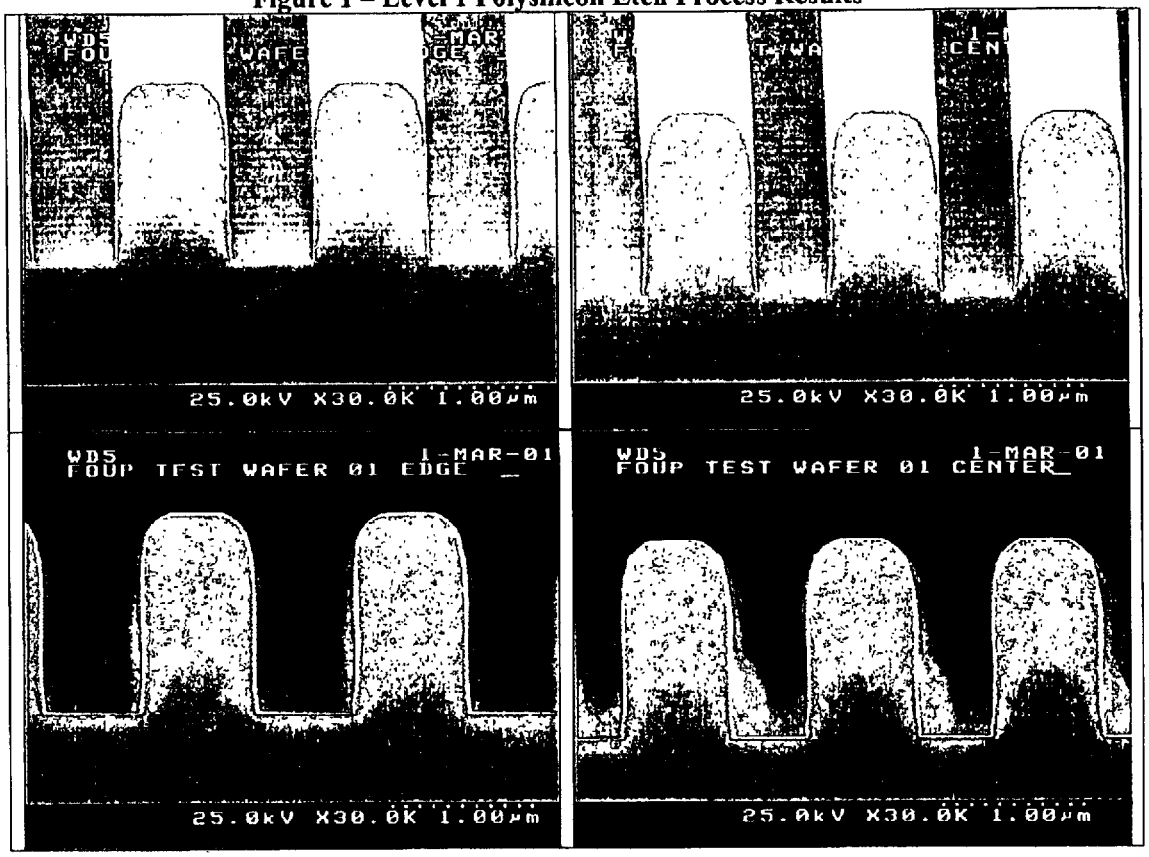
Figure 1 – Level 1 Polysilicon Etch Process Results

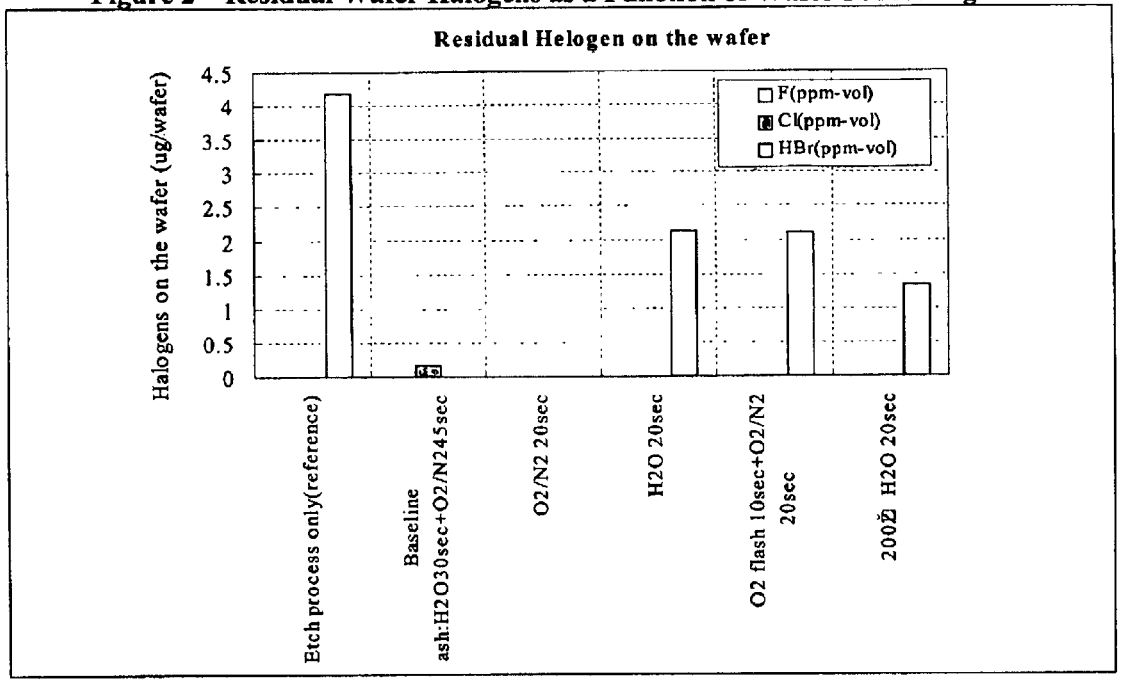
Figure 2 – Residual Wafer Halogens as a Function of Wafer Processing

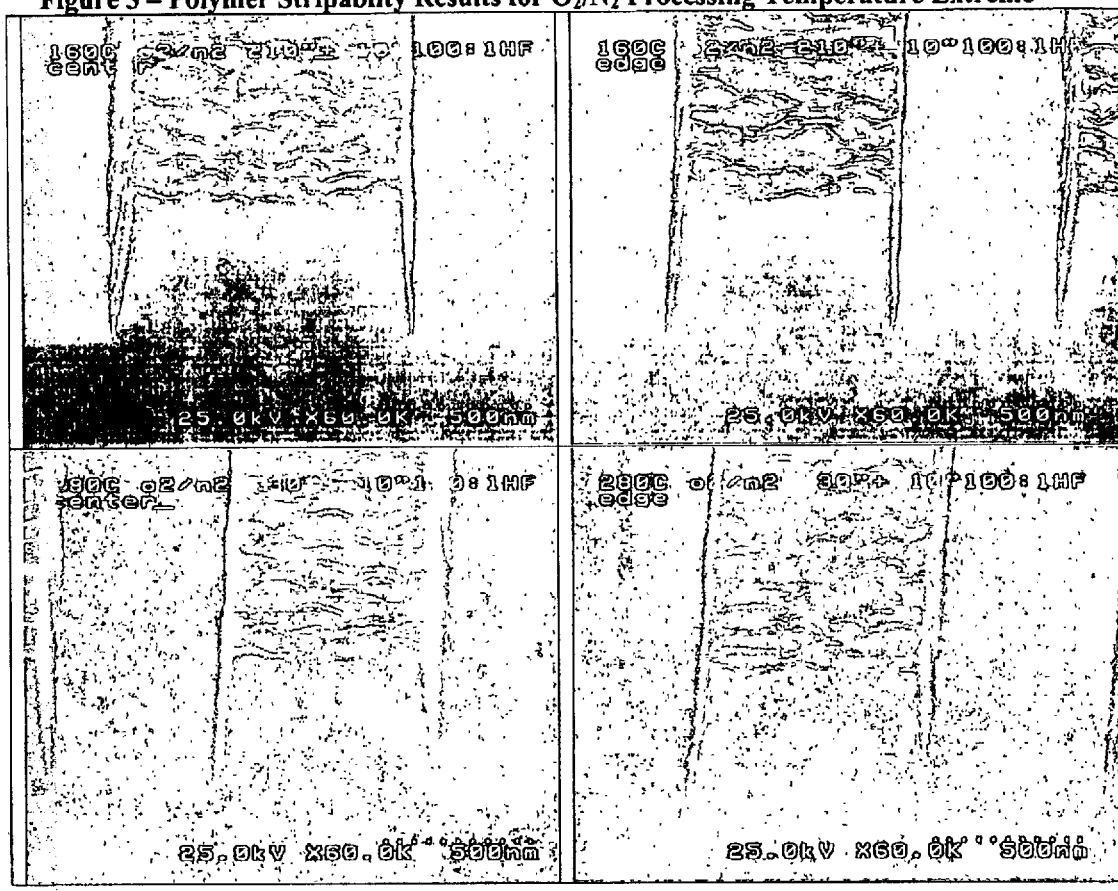
Figure 3 – Polymer Stripabilty Results for $O_2/N_2$ Processing Temperature Extreme

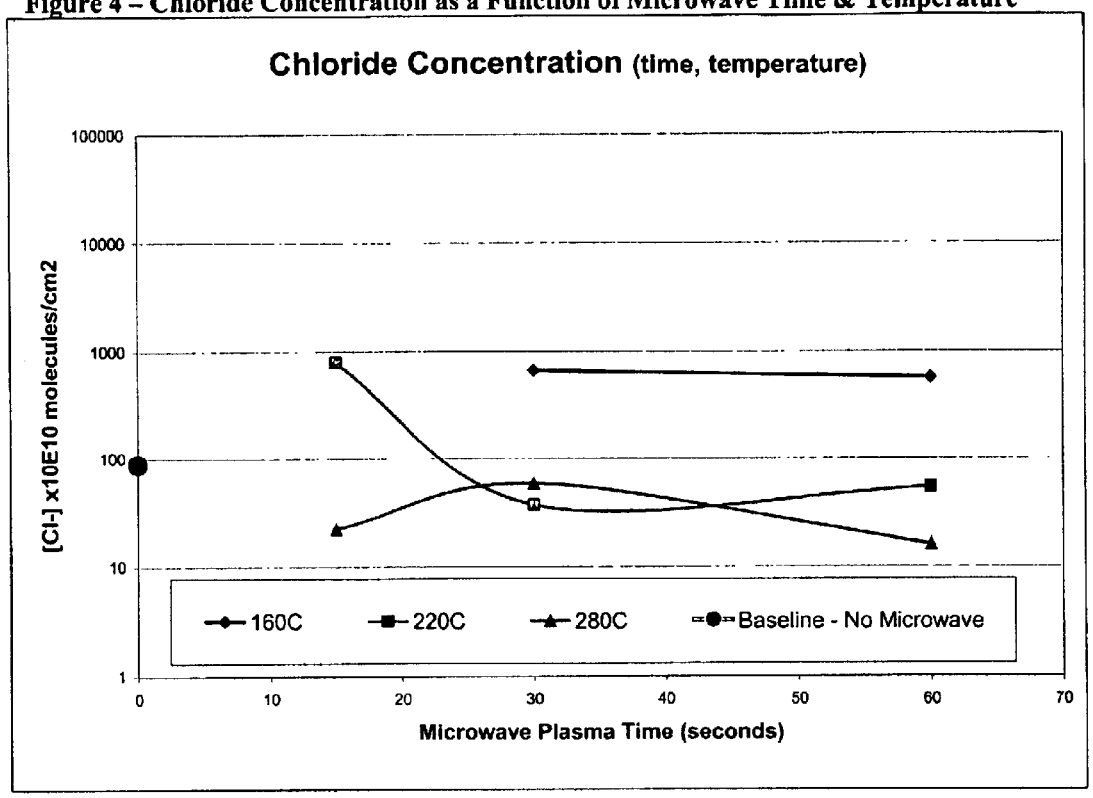
Figure 4 – Chloride Concentration as a Function of Microwave Time & Temperature

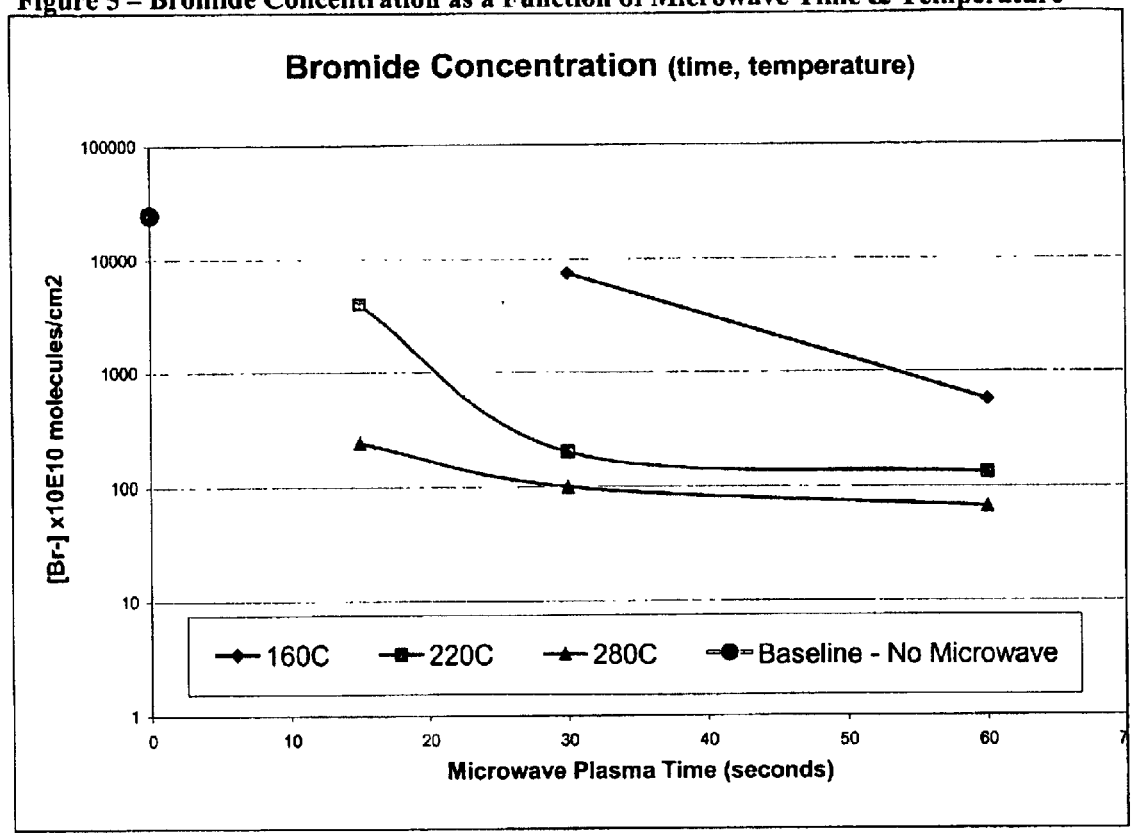
Figure 5 – Bromide Concentration as a Function of Microwave Time & Temperature

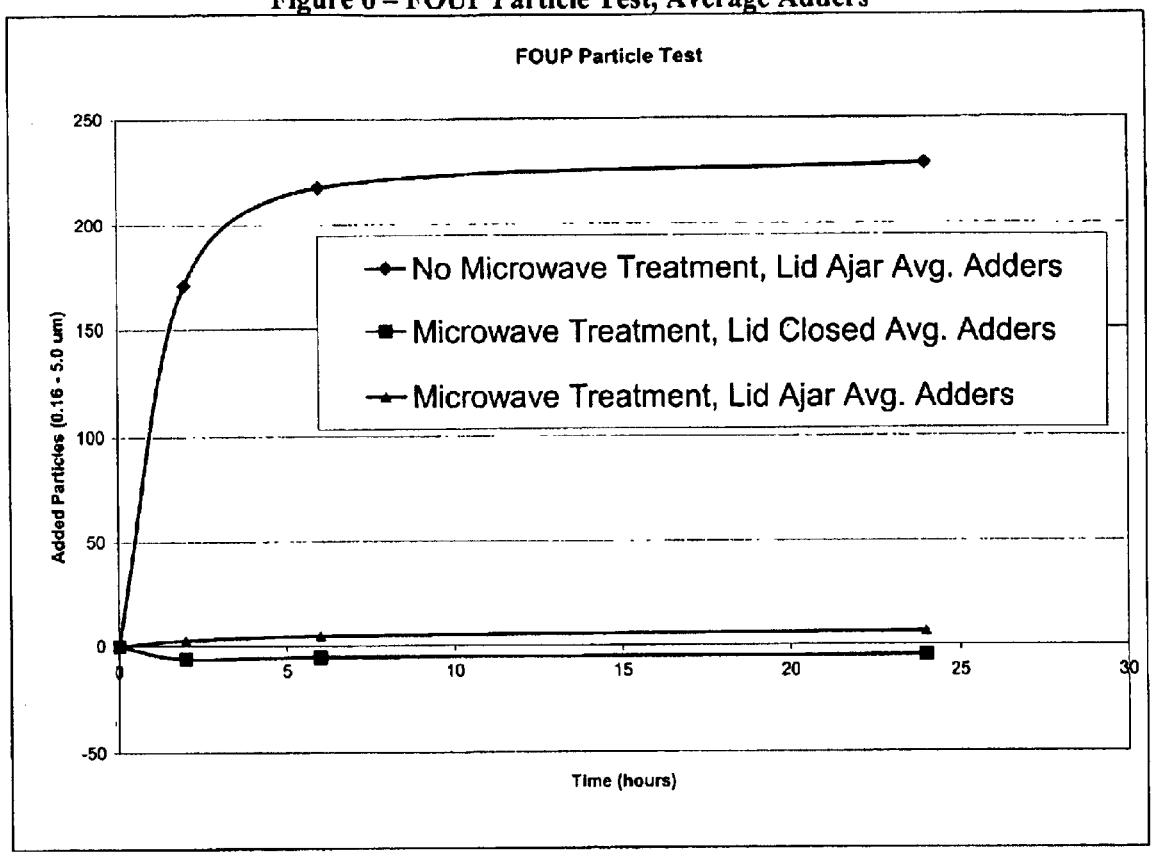
Figure 6 – FOUP Particle Test, Average Adders

RESIDUAL HALOGEN REDUCTION WITH MICROWAVE STRIPPER

CROSS REFERENCE TO RELATED APPLICATION

This application claims priority of U.S. Provisional Patent Application Ser. No. 60/304,905 filed Jul. 11, 2001.

BACKGROUND OF THE INVENTION

The present invention relates to the manufacture of semiconductor devices. More particularly, the present invention relates to the reduction of post etch gasses or byproducts with the use of an O2/N2 stripping plasma immediately before the wafer is transferred to a wafer carrier, cassette, SMIF pod, Front Opening Unified Pod (FOUP) or other pod.

Semiconductor process tools often stage post-etched wafers with pre-etched wafers in a wafer carrier, cassette, FOUP or other pod. These wafers are not under vacuum, but in the case of containment in a pod are isolated from certain conditions present in the wafer-fab providing enhanced protection against airborne particulates. Typical main chamber processing chemistry involves the use of hydrogen bromide (HBr), chlorine (Cl2) and other gases. Bromides absorbed on the surface of the processed wafers tend to give off gas (outgas) inside the pod at atmospheric conditions and condense as a brominated haze on the unetched wafer surface. These brominated condensates may become an etch defect due to micromasking and may result in yield reduction. A microwave post-etch treatment can eliminate brominated cross contamination caused by the outgas of bromide etched wafers.

SUMMARY OF THE INVENTION

The objective of this invention is to reduce the concentration of post-etch gasses and byproducts in the FOUP. To accomplish this objective, the invention applies a post etch plasma to the substrate. The preferred method of application involves the use of a high temperature ashing process using $O_2/N_2$ for a short time (approximately 15 seconds). Alternatively a lower temperature and longer process may be used to obtain similar dehalogenation. The ashing process could be done in any manner of asher, but would typically be done in a microwave or RF powered reactor.

BRIEF DESCRIPTION OF THE DRAWINGS

The present invention will be readily understood by the following detailed description in conjunction with the accompanying figures.

FIG. 1 is a cross section SEM showing the baseline polysilicon etch process.

FIG. 2 illustrates test results comparing a variety of strip combinations.

FIG. 3 is a cross section SEM showing the polymer stripability results for an $O_2/N_2$ strip at the processing temperature extreme.

FIG. 4 is a graph illustrating chloride concentration relative to various strip process parameters.

FIG. 5 is a graph illustrating bromide concentration relative to various strip process parameters.

FIG. 6 is a graph illustrating particle addition to the FOUP for several test parameters.

DETAILED DESCRIPTION OF THE PREFERRED EMBODIMENTS

FOUP condensation has been previously shown to be the result of residue on post etched wafers. $O_2/N_2$ microwave processing of post polysilicon etched wafers under the proper condition can dramatically reduce the bromide and chloride anion concentration as determined by ion chromatography. Using the microwave to fully remove the photoresist after polysilicon etch produced these favorable conditions. However, if the photoresist is not completely stripped then the bromide concentration will not be suitably reduced. An optimized microwave plasma treatment consisting of an $O_2/N_2$ process at 280 degrees celcius for 15 seconds offers the best compromise between bromide/chloride reduction and minimal throughput reduction. Microwave processing does not alter the post polysilicon etch polymer stripablity. Particle tests conducted with the optimized microwave process show a substantial reduction in condensation particle counts as compared to the baseline condition. These particle condensation results were verified with a polysilicon wafer haze test that showed none of the typical signs of FOUP condensation hazing.

Cluster tools stage post-etched wafers with pre-etched wafers in the FOUP. These wafers are not under vacuum, but are exposed to fab ambient atmospheric conditions. Typical main chamber processing chemistry involves the use of hydrogen bromide (HBr), chlorine (Cl2) and other gases. Bromides absorbed on the surface of the processed wafers tend to outgas inside the FOUP and condense as a brominated haze on the unetched wafer surface. These brominated condensates may become an etch defect due to micromasking and may result in a yield reduction.

200 mm patterned polysilicon (see Table 1) and bare silicon wafers were individually processed with a polysilicon etch process (see Table 2) and bare silicon wafers were individually processed with a polysilicon etch process (see Table 2) and Waferless Auto Clean process ("WAC", see Table 3). These wafers were then subjected to a variety of microwave processing conditions. Upon exiting the microwave wafers were automatically placed on the Alliance cool station and subjected to the baseline cool procedure (see Table 4).

TABLE 1

200 mm Patterned Polysilicon Test Wafer Structure

| Film | Thickness |
|---|---|
| Shipley photoresist | 12,000 Å |
| Undoped polysilicon | 5,000 Å |
| Thermal oxide | 1,000 Å |
| <100> silicon | Substrate |

1.2.0 mask - 0.5 μm line/space pattern

TABLE 2

200 mm Level One Polysilicon Etch Process

| | |
|---|---|
| DARC | 30mT/250W TCP/-185V$_b$/100 sccm CF$_4$/8 Torr He backside/15" |
| Main Etch | 20mT/250W TCP/-250V$_b$238 sccm HBr/24 sccm Cl$_2$/3 O$_2$ sccm/8 Torr He backside/EP @88% 405 nm (~166") |
| Overetch | 80mT/250W TCP/-200Vb/75 sccm HBr/2 O$_2$/425 sccm He/8 Torr He backside/80" |

Temperatures: 60° C. chamber/60° C. electrode

TABLE 3

Polysilicon Etch Process WAC

| | |
|---|---|
| Step 1 | 80 mT/800W TCP/100 sccm $SF_6$/20 sccm $O_2$/8 Torr He/33" |
| Step 2 | 20 mT/800W TCP/20 sccm $O_2$/8 Torr He/10" |

Temperatures: 60° C. chamber/60° C. electrode

TABLE 4

Baseline Alliance Cool Station Process

| | |
|---|---|
| Step 1 | 5 Torr He/2,000 Watts/20" |
| Step 2 | 0 Torr He/0 Watts/10" |

Temperatures: 60° C. chamber/60° C. electrode

Immediately after processing, the wafers were individually placed in virgin single-wafer carriers. They were then tested for leachable anion constituents by means of ion chromatography (IC). Optimization of the microwave treatment consisted of determining the lowest bromide ion (Br—) and other anion concentrations found from the experiments in Phase 1 and then devising a series of experiments to further refine the processing conditions.

Once an optimal process was determined a series of FOUP emulation tests were conducted. Atmospheric wafer box tests were designed to emulate conditions encountered in the FOUP. These tests consisted of placing a full cassette of bare silicon wafers processed with the polysilicon etch process+WAC+optimal microwave in both a sealed wafer box as well as a wafer box with its lid ajar. Particle tests were then conducted on these wafers at times: initial, +2 hours, +6 hours, and +24 hours. Additionally, another batch of wafers was processed without the microwave process and placed in an open box (lid ajar) as a FOUP reference standard. A successful microwave process would be judged based upon the completeness of halogen removal, minimal particle adders, and minimal wafer throughput impact.

Initial experimentation began with the verification of the baseline polysilicon etch process. One patterned polysilicon wafer was etched with the polysilicon etch process and then examined with a cross section SEM (FIG. 1). There was approximately 8,900 Å remaining photoresist both center and edge with relatively vertical sidewalls with no etch residue in the field. It was determined that these process results were acceptable to use for tests involving the microwave chamber.

Tests using a variety of strip formulas showed that the most successful post etch treatment for eliminating bromide atoms was obtained with an $O_2/N_2$ strip (FIG. 2). Thus, the first series of experiments was designed to baseline the standard polysilicon etch results and identify the first order significance of various microwave processing sequences. Table 5 below provides an overview of the test plans. Each wafer was individually loaded into the vacuum cassette elevator (VCE) and individually processed according to the test plan in Table 5. After processing, the VCE was vented and the wafer was immediately placed in a virgin single wafer carrier. The wafers were tested for ion chromatograhpy for extractable anions: ($F^-$), ($Cl^-$), ($Br^-$), ($NO_2^-$),($NO_3^-$),($SO_4^{2-}$) & ($PO_4^{3-}$). The results of these tests are listed in Table 6 below.

TABLE 5

Phase One General Test Plans

1. Baseline Poly Etch (BPE - Table 2) without Microwave processing
2. BPE + Baseline LRJ Microwave $O_2/N_2$ process - 2Torr/1.25 KW/3.6 L $O_2$/0.4 L $N_2$/160° C./30"
3. BPE + Baseline LRJ Microwave $O_2/N_2$ process - 2Torr/1.25 KW/3.6 L $O_2$/0.4 L $N_2$/220° C./30"
4. BPE + Baseline LRJ Microwave $O_2/N_2$ process - 2Torr/1.25 KW/3.6 L $O_2$/0.4 L $N_2$/280° C./30"
5. BPE + Microwave outgas (no processing) - 0Torr/120° C./30"
6. BPE + Microwave $H_2O$ flow (no plasma) - 9.9Torr/1 L $H_2O$/120° C./30"
7. BPE + Microwave $H_2O$ process - 9.9Torr/1.25 KW/1 L $H_2O$/160° C./30"
8. BPE + Microwave $H_2O$, then $O_2/N_2$ process - 9.9Torr/1.25 KW/1 L $H_2O$/30" + 2Torr/1.25 KW/3.6 L $O_2$/0.4 L $N_2$/30"- 160° C.
9. BPE + Microwave $O_2/N_2$ then $H_2O$ process - 2Torr/1.25 KW/3.6 L $O_2$/0.4 L $N_2$/30" + 9.9Torr/1 L $H_2O$/120° C./30" - 160° C.
10. BPE + Microwave $O_2/N_2/H_2O$ process - 2Torr/1.25 KW/3.6 L $O_2$/0.4 L $N_2$/1.0 L $H_2O$ 160° C./30"
11. Harmeet Singh's Baseline Poly Etch (very similar Table 2) on bare silicon without Microwave

TABLE 6

Phase 1 General Test Plans and Results

| Tests *,,* | $F^-$ x$10^{10}$ | $Cl^-$ x$10^{10}$ | $Br^-$ x$10^{10}$ | $NO_2^-$ x$10^{10}$ | $PO_3^{2-}$ x$10^{10}$ | $SO_4^{2-}$ x$10^{10}$ |
|---|---|---|---|---|---|---|
| 1. Baseline Poly Etch (BPE) without Microwave processing | <25 | 88 | 25,000 | 1800 | <10 | 260 |
| 2. BPE + Baseline LRJ Microwave $O_2/N_2$ process - 160° C./30" | <25 | 670 | 7,500 | 600 | 160 | 40,000 |
| 3. BPE + Baseline LRJ Microwave $O_2/N_2$ process - 220° C./30"‡ | 1,100 | 37 | 200 | 750 | 97 | 22,000 |
| 4. BPE + Baseline LRJ Microwave $O_2/N_2$ process - 280° C./30"‡ | <25 | 58 | 100 | 950 | 60 | 6,500 |
| 5. BPE + Microwave outgas (no processing) - 120° C./30" | <25 | 98 | 25,000 | 2,100 | <10 | 410 |
| 6. BPE + Microwave $H_2O$ flow (no plasma) - 1 L/120° C./30" | <25 | 100 | 20,000 | 1,700 | <10 | 210 |
| 7. BPE + Microwave $H_2O$ process - 160° C./30" | <25 | 41 | 18,000 | 1,200 | <10 | 1,100 |
| 8. BPE + Microwave $H_2O$ process followed by $O_2/N_2$ process - 160° C./30" + 30" | <25 | 97 | 1,800 | 1,200 | 17 | 49,000 |

TABLE 6-continued

Phase 1 General Test Plans and Results

| Tests *,,* | $F^-$ $\times 10^{10}$ | $Cl^-$ $\times 10^{10}$ | $Br^-$ $\times 10^{10}$ | $NO_2^-$ $\times 10^{10}$ | $PO_3^{2-}$ $\times 10^{10}$ | $SO_4^{2-}$ $\times 10^{10}$ |
|---|---|---|---|---|---|---|
| 9. BPE + Microwave $O_2/N_2$ process followed by $H_2O$ process - 160° C./30" + 30" | <25 | 440 | 2,500 | 1,100 | 67 | 16,000 |
| 10. BPE + Microwave $O_2/N_2/H_2O$ process - 160° C./30" | <25 | 20 | 5,000 | 1,200 | 21 | 9,200 |
| 11. Harmeet Singh's Baseline Poly Etch on bare silicon w/o Microwave | <25 | 350 | 14,000 | 5,400 | <10 | 53,000 |

Detection Limits:
(F) $25 \times 10^{10}$, (Cl$^-$) $15 \times 10^{10}$, (NO$^{2-}$) $20 \times 10^{10}$, (Br$^-$) $5 \times 10^{10}$, (SO$_4^{2-}$) $10 \times 10^{10}$, (PO$_4^{3-}$) $10 \times 10^{10}$
‡Photoresist cleared
*Note All samples showed nitrates below detection limit (NO$^{3-}$) $15 \times 10^{10}$
**Note Sample readings from right side of wafer where particle measure showed significant haze, NO$_3$:3,700
***Note Wafer samples 1–7 were extracted 3 days after vendor receipt, 8–11 were extracted 4 days after vendor receipt All microwave recipes were run without a heat-up step typically used in microwave processing. This was done to maximize throughput. A stability step was used before each microwave power on step.

Inspection of the data shows that there was a marked and favorable reduction in the bromide concentration for the tests with 220° C. and 280° C. of $O_2/N_2$ plasma treatment for 30 seconds. There is also a pronounced reduction with the 160° C./30 seconds process as well, but not nearly to the extent of the higher temperature tests. Also, placing the water vapor plasma before or after the $O_2/N_2$ process (@ 160° C./30 seconds, tests 8 and 9) reduced the bromide concentration considerably, but not to the extent seen at the higher temperature processing.

The use of the microwave without plasma at 120° C. for 30 seconds (test 5) did nothing to reduce the bromide concentration. A higher temperature and longer time period may promote desorption of the brominated by-products, but these conditions may cause the photoresist mask to flow (i.e., $T_{microwave} > T_{g\text{-}photoresist}$) and/or the photoresist to harden.

Flowing 1 liter of water vapor at 9.9 Torr using the same temperature and time conditions in the foregoing paragraph slightly improved the bromide concentration, but not to a large enough extent to be viable. It is of note that the pressure conditions used during this test result in a nearly identical water vapor flux as what would be found at atmospheric pressure and 40% relative humidity (typical fab environment).

The use of a three gas microwave process —$O_2/N_2/H_2O$ at 160° C. was moderately more effective than the dual gas process —$O_2/N_2$ at 160° in reducing the bromide concentration, but it was not as effective as sequencing the microwave process first with the $H_2O$ plasma followed by the $O_2/N_2$ plasma. Additions of $H_2O$ to $O_2/N_2$ plasmas result in photoresist strip rate reductions. It is interesting to note that this sample had the lowest chloride concentration. Test #7 also had a very low chloride concentration despite the high bromide concentration. This underscores the viability of $H_2O$ plasmas for their role in reducing chloride concentrations (e.g., post metal etch passivation processing).

One principal concern associated with dry stripping of photoresist is the ability to remove the sidewall polymer. Thus, the sidewall polymer for the $O_2/N_2$ plasma treatment extremes was verified with SEM analysis. Samples 2 (160° C.) and sample 4 (280° C.) were treated with a standard 100:1 post polysilicon strip dip, spin-rinse-dry, and then were cross section SEM analyzed, these results are given in FIG. 3. Due to the remaining resist on sample 2, it received an additional 120 second microwave strip, identical to its previous test conditions, to insure complete resist removal. FIG. 3 shows that in either processing temperature, there is no visible polymer remaining after the standard post photoresist strip treatment. Thus, it appears that the microwave does not complicate the photoresist removal process associated with polysilicon etching.

After reviewing the previous data, it was decided that additional tests would be conducted to determine the optimal $O_2/N_2$ processing conditions. Thus, the standard polysilicon etch/WAC was used to process the baseline polysilicon wafers and the microwave post etch treatment was varied in the following method shown in Table 7.

TABLE 7

Phase 2 General Test Plans

12. BPE + Baseline LRJ Microwave $O_2/N_2$process - 160° C./60"
13. BPE + Baseline LRJ Microwave $O_2/N_2$process - 220° C./15"
14. BPE + Baseline LRJ Microwave $O_2/N_2$process - 220° C./60"
15. BPE + Baseline LRJ Microwave $O_2/N_2$process - 280° C./15"
16. BPE + Baseline LRJ Microwave $O_2/N_2$process - 280° C./60"

Fixed Microwave Conditions: 2 Torr/3.6 liters $O_2$/0.4 liters $N_2$/pins down

As before, each wafer was individually loaded into the vacuum cassette elevator (VCE) and individually processed according to the test plan in Table 7, after processing, the VCE was vented and the wafer was immediately placed in a virgin single wafer carrier. These wafers were then tested for ion chromatography for extractable anions: (F—),(Cl—), (Br—), (NO$_2$—),(NO$_3$—),(SO$_4^2$—), & (PO$_4^3$—). The results of these tests are given below in Table 8.

TABLE 8

Phase 2 General Test Plans and Results

| Test* | F<sup>—</sup> x10$^{10}$ | Cl<sup>—</sup> x10$^{10}$ | Br<sup>—</sup> x10$^{10}$ | NO$_2$<sup>—</sup> x10$^{10}$ | NO$_3$<sup>2—</sup> x10$^{10}$ | SO$_4$<sup>2—</sup> x10$^{10}$ |
|---|---|---|---|---|---|---|
| 12. BPE + Baseline LRJ Microwave O$_2$/N$_2$ process - 160° C./60"‡ | 6,300 | 61 | 570 | 1,000 | 34 | 39,000 |
| 13. BPE + Baseline LRJ Microwave O$_2$/N$_2$ process - 220° C./15"‡ | 13,000 | 790 | 4,000 | 1,500 | <15 | 16,000 |
| 14. BPE + Baseline LRJ Microwave O$_2$/N$_2$ process - 220° C./60"‡ | 7,400 | 54 | 130 | 530 | 50 | 1,200 |
| 15. BPE + Baseline LRJ Microwave O$_2$/N$_2$ process - 280° C./15"‡ | 7,200 | 22 | 240 | 610 | <15 | 8,500 |
| 16. BPE + Baseline LRJ Microwave O$_2$/N$_2$ process - 280° C./60"‡ | 7,800 | 16 | 67 | 570 | <15 | 7,700 |

Detection Limits:
(F) 25 × 10$^{10}$, (Cl<sup>—</sup>) 15 × 10$^{10}$, (No$_2$<sup>—</sup>) 20 × 10$^{10}$, (NO$_3$<sup>—</sup>) 15 × 10$^{10}$ (Br<sup>—</sup>) 5 × 10$^{10}$, (SO$_4$<sup>2—</sup>) 10 × 10$^{10}$,
‡Photoresist cleared
*Note All samples showed phosphate below detection limit (PO$_4$<sup>3—</sup>) 15 × 10$^{10}$ Review of the Phase 2 tests results reveal several items of interest. First, the level of fluoride increased dramatically over the Phase 1 test results. This was due to the 3–4 day extraction queue during the Phase 1 ion chromatography analysis versus the same day extraction for the Phase 2 analysis. This is apparently due to fluoride desorping off the wafer surface (as HF vapor) within a relatively short 0–3 day timeframe. Secondly, the chloride value results for the higher temperature processing is just at the detection limit for the 60 second strip and approximately the same value as the best Phase 1 test results.

Third, and most importantly, the bromide concentration for the wafers where the photoresist was completely stripped was desirably low; especially for the high temperature processing. The best bromide concentration was found with the 280° C./60 second strip with a Br— of 67×10$^{10}$ atoms/cm$^2$; however with 280° C./15 second strip the bromide concentration was measured at [Br—] of 240×10$^{10}$ atoms/cm$^2$. A graphical representation of the chloride and bromide concentration as a function of time and temperature is given in FIGS. 4 and 5.

In light of the overall excellent bromide and chloride concentrations associated with 280° C. microwave processing and the need to maintain high throughput, the optimal processing conditions for the post polysilicon etch microwave treatment was determined to be 280° C. for 15 seconds.

Using the 280° C./15 seconds O$_2$/N$_2$ microwave process as the optimal process, wafer box tests were run to emulate those conditions encountered in the FOUP. Three types of tests were performed. The first two tests consisted of processing 22 bare silicon wafers (wafers 2 through 23) with the polysilicon etch process & WAC with the optimal microwave process. Wafers 1 and 24 were particle monitor wafers and wafer 25 was a cassette cover wafer. After processing the first test, the wafer batch was placed in a sealed wafer box, whereas, the second test wafer batch was placed in a wafer box with its lid ajar. The third test was a baseline test where the wafers were processed as above, but without the microwave post polysilicon etch treatment. This test wafer batch was placed in a wafer box with its lid ajar.

Particle measurements were taken during these tests at time intervals: pre-test, 2 hours, 6 hours, and 24 hours. Particle counts consisted of particles measured over a range of 0.16 μm to 5.0 μm and haze defects. Table 9 displays the results of these particle tests:

TABLE 9

FOUP Emulation Particle Test Results

| Test Description | Time (hours) | Wafer 01 particles | Wafer 24 particles | Average added particles |
|---|---|---|---|---|
| Baseline - wafer box lid ajar | 0 | 56 | 37 | 0 |
|  | 2 | 396 | 39 | 171 |
|  | 6 | 488 | 40 | 217.5 |
|  | 24 | 449 | 101 | 228.5 |
| Microwave treatment - wafer box lid closed | 0 | 51 | 44 | 0 |
|  | 2 | 48 | 35 | −6 |
|  | 6 | 48 | 36 | −5.5 |
|  | 24 | 49 | 36 | −5 |
| Microwave treatment - wafer box lid ajar | 0 | 49 | 40 | 0 |
|  | 2 | 55 | 39 | 2.5 |
|  | 6 | 55 | 43 | 4.5 |
|  | 24 | 52 | 50 | 6.5 |

The results obtained in Table 9 demonstrate that the particle issues associated with halogen condensation (most likely in the form of bromine hyrdrate —Br$_2$.10H$_2$O) have been essentially eliminated with the use of the microwave. This is seen for both static ambient air and for nominal ambient air circulation (i.e., closed box and lid ajar test conditions). This data is illustrated graphically in FIG. 6.

The microwave post polysilicon etch treatment virtually eliminates particle condensation that is typically seen on wafers that have not been treated and are exposed to ambient circulating air as in the FOUP. One final test was conducted to verify the effectiveness of the microwave treatment. A patterned polysilicon wafer was etched as before with the Level 1 process and WAC and then processed in the microwave with the optimized 280° C./15 second process. It was then removed from the tool and inspected for signs of hazing. This hazing is typical of the FOUP condensation mechanism. The wafer was then regularly inspected using a high numerical aperature confocal microscope over the same intervals at the particle measurements mentioned above, namely at 2, 6, and 24 hours. During this inspection period, the wafer was not found to have any form of hazing.

Based on the data analysis above, it is apparent that O$_2$/N$_2$ microwave processing under the proper conditions can dramatically reduce the bromide and chloride anions concentration as determined by ion chromatography. Using the microwave to fully remove the photoresist after polysilicon etch resulted in these favorable conditions. However, if the photoresist is not completely stripped, then the bromide concentration will not be suitably reduced. It was found that an optimized microwave plasma treatment consisting of an $O_2/N_2$ process @ 280° C. for 15 seconds offered the best compromise between bromide/chloride reduction and minimal throughput reduction.

Particle tests conducted with the optimized microwave process showed a very substantial reduction (>97%) in condensation particle counts as compared to the baseline condition. These particle condensation results were verified with a wafer haze test that showed none of the typical signs of FOUP condensation hazing.

In closing, its has been shown that the microwave stripper, when used with an optimized $O_2/N_2$ process @ 280° C. for 15 seconds is the best compromise between bromide/chloride reduction and has minimal throughput reduction.

Particle tests conducted with the optimized microwave process showed a very substantial reduction (>97%) in condensation particle counts as compared to the baseline condition. These particle condensation results were verified with a wafer haze test that showed none of the typical signs of FOUP condensation hazing. It has been shown that the microwave stripper, when used with an optimized $O_2/N_2$ process at 280° C. for 15 seconds, has successfully eliminated FOUP condensation. Due to the relatively short processing time, the microwave and associated cool station process should have only a slight impact on throughput. Thus, the microwave is offered as one of the solutions to the FOUP condensation issue.

While this invention has been described in terms of a preferred embodiment, there are alterations, permutations, and equivalents which fall within the scope of this invention. It should also be noted that there are many alternative ways of implementing the present invention. It is therefore intended that the following appended claims be interpreted as including all such alterations, permutations, and equivalents as fall within the true spirit and scope of the present invention.

What is claimed is:

1. A post-etch method for reducing halogen gasses and byproducts consisting of the following steps:
   placing a substrate in a chamber;
   exposing the substrate to a water vapor process;
   flowing exclusively O2/N2 gas into the chamber;
   creating a plasma from the gas in the chamber.

2. The post-etch method for reducing halogen gasses and byproducts of claim 1, wherein the plasma is induced by one of microwave frequency power.

3. The post-etch method for reducing halogen gasses and byproducts of claim 1, wherein byproducts are defined as one brominated materials.

4. The post-etch method for reducing halogen gasses and byproducts of claim 1, wherein the chamber is capable of receiving plasma products.

5. The post-etch method for reducing halogen gasses and byproducts of claim 1, wherein the heating of substrates to processing temperatures regulated from about 20 degrees Celsius to about 300 degrees Celsius provides optimal removal rates.

6. A method for post-etch material removal and passivation on a substrate comprised of:
   placing the substrate in a chamber capable of receiving plasma products;
   delivering vapor to the chamber; and
   delivering plasma products of $O_2/N_2$ gas to the chamber.

7. A method for post-etch material removal and passivation on a substrate comprised of:
   placing the substrate in a chamber capable of receiving plasma products;
   heating the substrate;
   delivering water vapor to the chamber; and
   delivering plasma products of $O_2/N_2$ gas to the chamber.

8. The method of claim 7, wherein the chamber is capable of producing a plasma or receiving plasma products by one of microwave frequency power.

9. The method of claim 7, wherein the heating of substrates to processing temperature regulated from about 20 degrees Celsius to about 300 degrees Celsius provides optimal removal rates.

10. The method of claim 7, wherein a reduction of halogen gasses and byproducts is provided on the substrate.

11. The method of claim 7, wherein the material removed is one of polymerized and non-polymerized photoresists, residues, organic polymers and organic/inorganic compounds.

12. The method of claim 7, wherein the passivation provided is for one of Hydrogen-Bromide, Chlorine, and Fluorine.

13. A method for providing post-etch material removal, chemical passivation and transfer of a substrate comprised of:
   placing tho substrate in a chamber capable of receiving plasma products;
   heating the substrate;
   delivering water vapor to the chamber;
   delivering plasma products of $O_2/N_2$ gas to the chamber;
   removing the substrate from the chamber;
   cooling the substrate; and
   placing the substrate in one of a sealed container and a pod.

14. A method for providing post-etch material removal, chemical passivation and transfer of a substrate of claim 13, wherein the heating the substrates is regulated from about 20 degrees Celsius to about 300 degrees Celsius.

15. A method for providing post-etch material removal, chemical passivation and transfer of a substrate of claim 13, wherein a reduction of halogen gasses and byproducts is provided on the substrate.

16. A method for providing post-etch material removal, chemical passivation and transfer of a substrate of claim 13, wherein the chamber is capable of producing a plasma or receiving plasma products by one of microwave frequency power.

17. A method for providing post-etch material removal, chemical passivation and transfer of a substrate of claim 13, wherein passivation is for one of Hydrogen-Bromide, Chlorine, and Fluorine.

18. A method for providing post-etch material removal, chemical passivation and transfer of a substrate of claim 13, wherein placing the substrate in one of a sealed container and a pod provides protection against airborne particulates.

* * * * *